United States Patent
Aruga (10) Patent No.: US 7,249,897 B2
(45) Date of Patent: Jul. 31, 2007

(54) OPTICAL MODULE

(75) Inventor: Hiroshi Aruga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/467,969

(22) Filed: Aug. 29, 2006

(65) Prior Publication Data

US 2007/0053639 A1 Mar. 8, 2007

(30) Foreign Application Priority Data

Sep. 5, 2005 (JP) .............................. 2005-256532

(51) Int. Cl.
*G02B 6/36* (2006.01)
(52) U.S. Cl. ............................ 385/94; 385/92; 385/88; 385/14
(58) Field of Classification Search .................. 385/14, 385/53, 76, 77, 80, 88, 89, 92, 93, 94, 139
See application file for complete search history.

(56) References Cited

U.S. PATENT DOCUMENTS 5,295,214 A * 3/1994 Card et al. ..................... 385/92
5,604,831 A * 2/1997 Dittman et al. ................ 385/88
5,632,630 A * 5/1997 Card et al. ...................... 439/79
6,786,627 B2 * 9/2004 Takagi et al. ................ 362/555
6,976,795 B2 * 12/2005 Go et al. ....................... 385/92
2007/0053639 A1 * 3/2007 Aruga .......................... 385/94

FOREIGN PATENT DOCUMENTS

JP 11-202166 7/1999

OTHER PUBLICATIONS

XMD MSA Committee; "Multi-Source Agreement (MSA) of 10 Gbit/s Miniature Device (XMD)", XMD)$, Physical Interface of TOSA Type 2 Package Rev. 1.1 (Oct. 29, 2004), pp. 1-9.

* cited by examiner

*Primary Examiner*—Brian M. Healy
(74) *Attorney, Agent, or Firm*—Leydig, Voit & Mayer, Ltd.

(57) ABSTRACT

An optical module includes an optical connector on one end of a package for storing a carrier including an optical element, and a laminated ceramic feedthrough disposed on the other end of the package. The feedthrough includes on an outer surface an electrical terminal perpendicular to the optical axis of light incident on and exiting from the optical connector, and includes on its inner surface a chip carrier connection terminal connected to the electrical terminal. A flexible printed circuit board includes a connection pad acting as an electrical terminal at a position corresponding to the electrical terminal of the feedthrough and is fixed to the feedthrough with an anisotropic conductive adhesive.

5 Claims, 11 Drawing Sheets

Fig. 11

OPTICAL MODULE

BACKGROUND OF THE INVENTION

1. Field of the Invention

The present invention relates to an optical module, and more particularly, to an optical module in which a package for storing a carrier having optics is integrated with an optical connector.

2. Background Art

Figure 11:
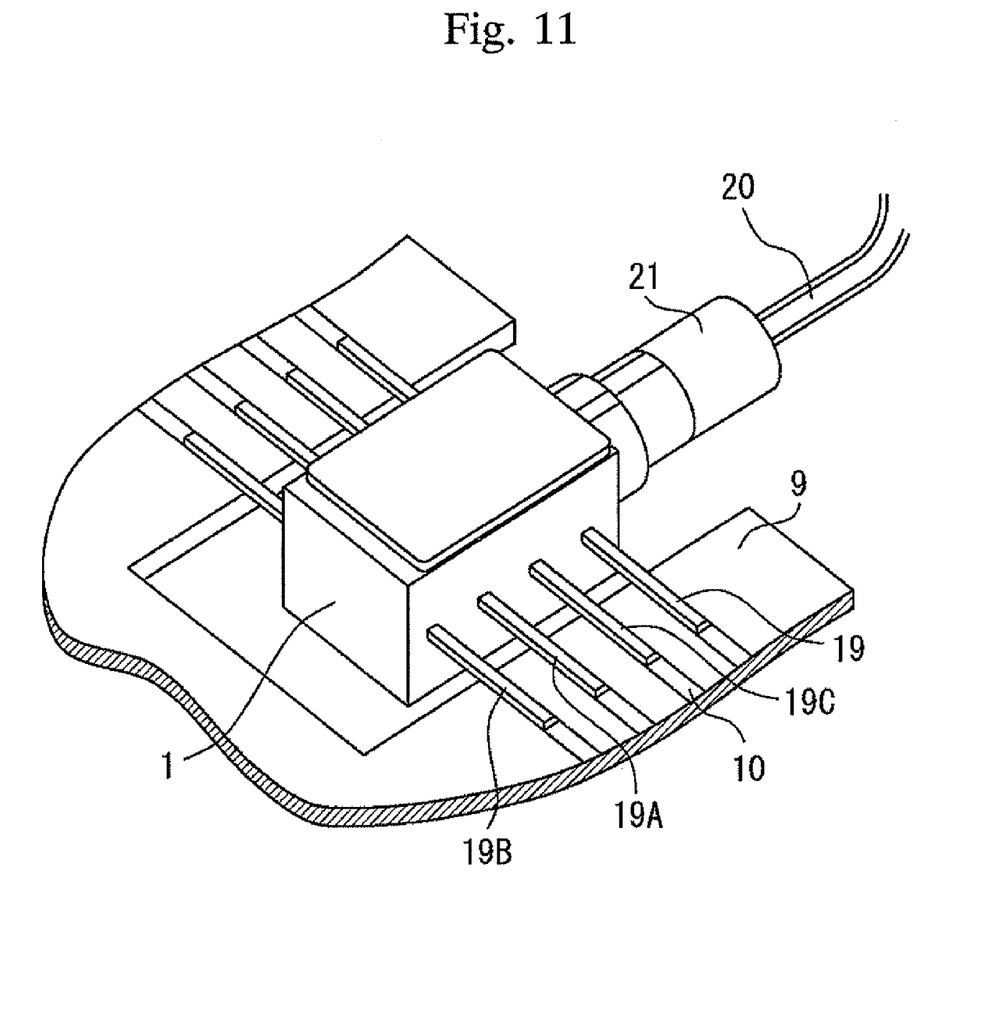
FIG. 11 is a perspective view showing the configuration of a conventional optical module.

FIG. 11 is a perspective view showing the configuration of a conventional optical module which is called a butterfly module. In this optical module, light is inputted and outputted through a fiber 20 attached to a fiber holder 21 provided on one end of a package 1.

A plurality of lead pins 19 are provided on both sides of the package 1 as an interface of an electrical signal. To be specific, a lead pin 19A for transmitting an electrical modulation signal is provided and lead pins 19B and 19C for transmitting a ground return signal are provided on both sides of the lead pin 19A.

When the optical module is mounted on an optical transceiver, in order to ensure transmitting characteristics to a high frequency, the lead pins 19 and printed board wires 10 are connected so as to minimize a gap between the optical module including the package 1 and a printed board 9 provided in the optical transceiver (for example, Japanese Patent Laid-Open No. 11-202166).

The conventional optical module is configured thus. The printed board 9 and the package 1 of the optical module, when being assembled into an optical transceiver, can be mounted in consideration of high-frequency characteristics.

However, when the optical module is integrated with an optical connector without using the fiber 20 to achieve miniaturization and mounted in an optical transceiver, the optical connector is fixed on a predetermined position of the optical transceiver; meanwhile the printed board is used also as a card edge connector and thus is fixed on a predetermined position of the optical transceiver. Therefore, in order to absorb a tolerance in terms of the mechanism of the optical transceiver, a clearance is necessary between the optical module and the printed board.

For this reason, the conventional configuration shown in FIG. 11 is hard to satisfy the demand in terms of the mechanism and the demand from high frequency characteristics simultaneously.

SUMMARY OF THE INVENTION

The present invention is devised to solve this problem. An object of the present invention is to provide an optical module which can satisfy the demand in terms of the mechanism and the demand from high frequency characteristics simultaneously in an optical transceiver.

According to one aspect of the present invention, an optical module in which an optical connector is disposed on one end of a package for storing a carrier having an optic, comprising: a feedthrough which is disposed on the other end of the package, is formed by laminating ceramic, includes on an outer surface an electrical terminal perpendicularly to an optical axis of light incoming/outgoing from and to the optical connector, and includes on an inner surface a carrier connection terminal connected to the electrical terminal, and a flexible printed circuit board which includes a connection pad acting as an electrical terminal on a position corresponding to the electrical terminal of the feedthrough and is fixed to the feedthrough with an anisotropic conductive adhesive.

The optical module of the present invention is configured thus and makes it possible to satisfy the demand in terms of the mechanism and the demand from high frequency characteristics simultaneously in the configuration of an optical transceiver.

Other and further objects, features and advantages of the invention will appear more fully from the following description.

DETAILED DESCRIPTION OF THE PREFERRED EMBODIMENTS

First Embodiment

Figure 1:
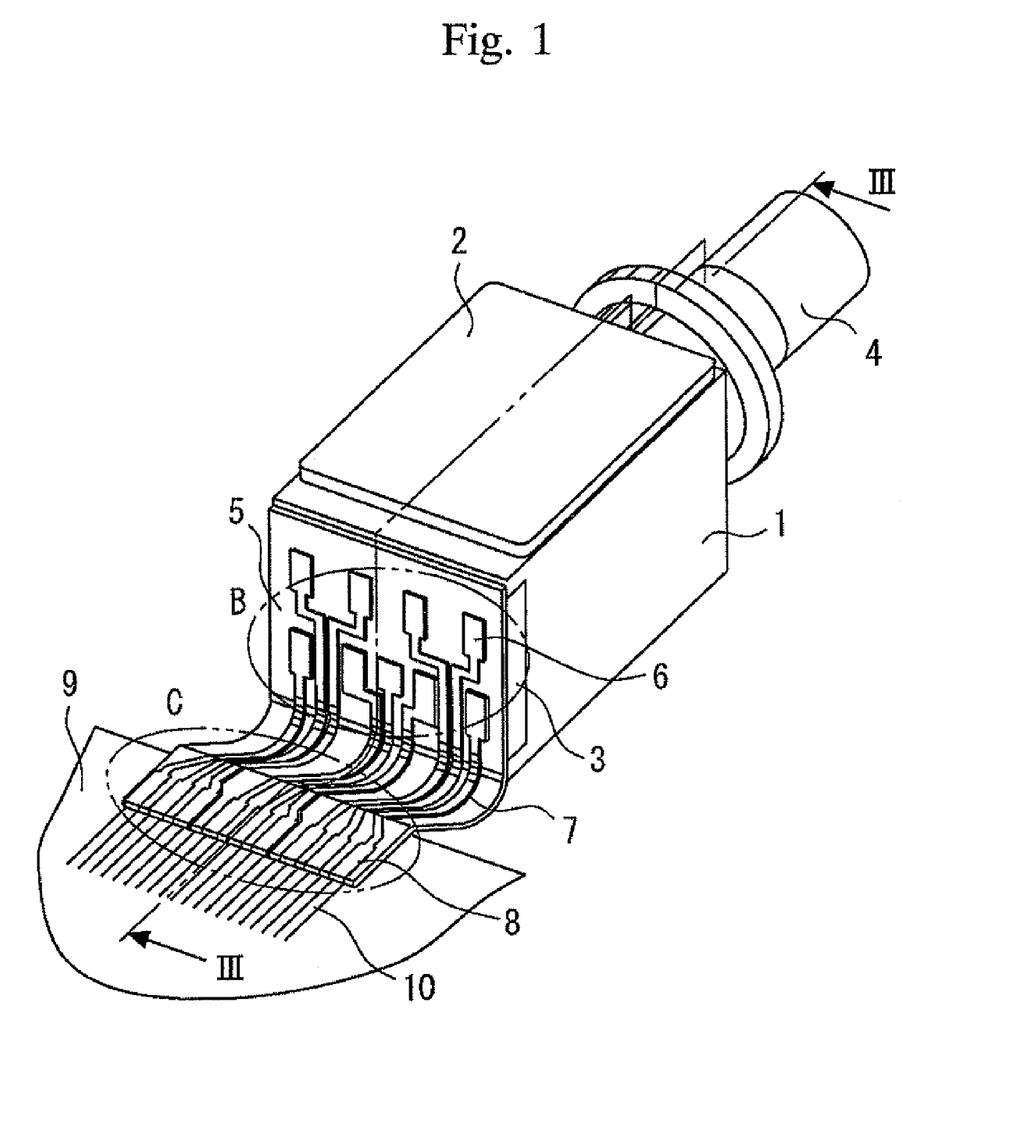
FIG. 1 is a perspective view showing the configuration of First Embodiment.
Figure 2:
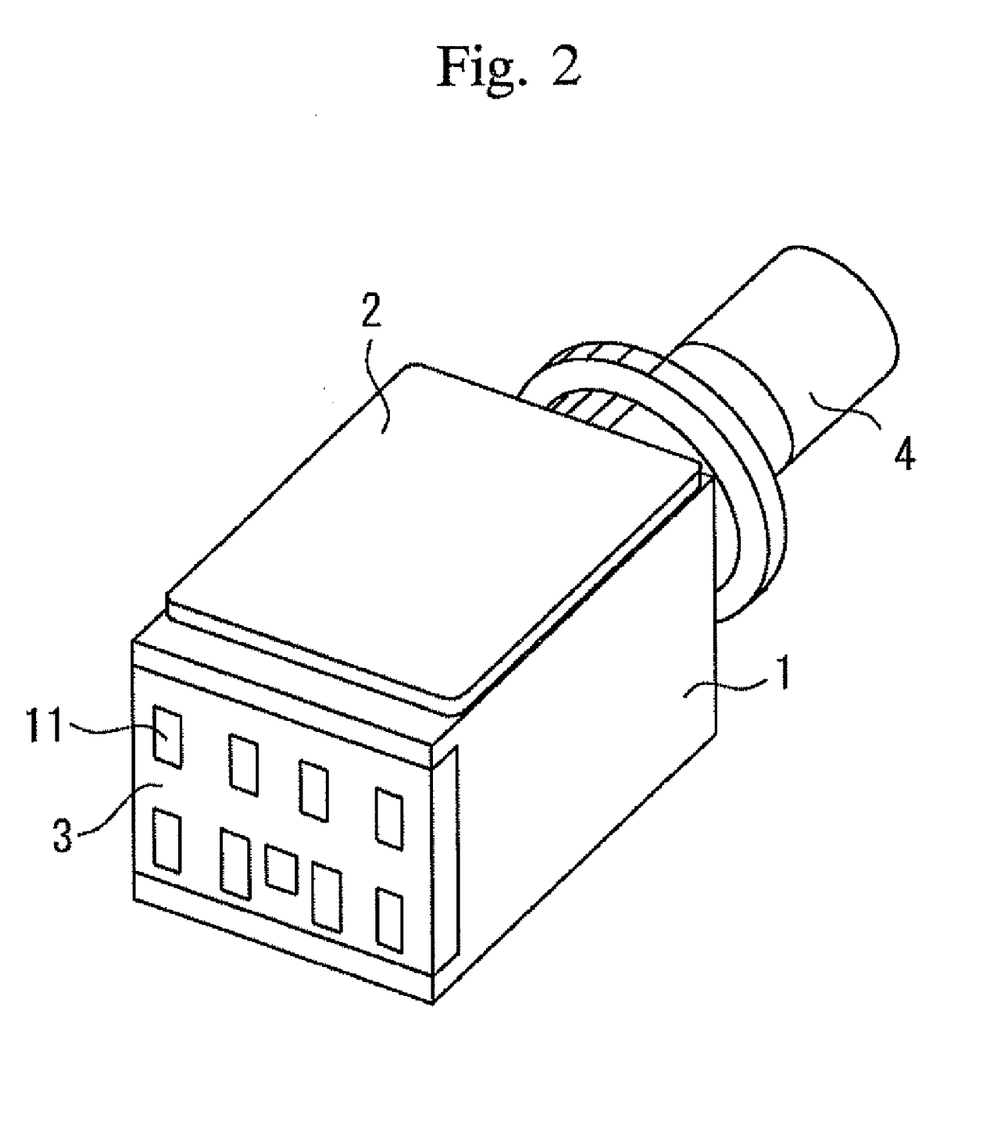
FIG. 2 is a perspective view showing that a flexible printed circuit board is removed from First Embodiment.
Figure 3:
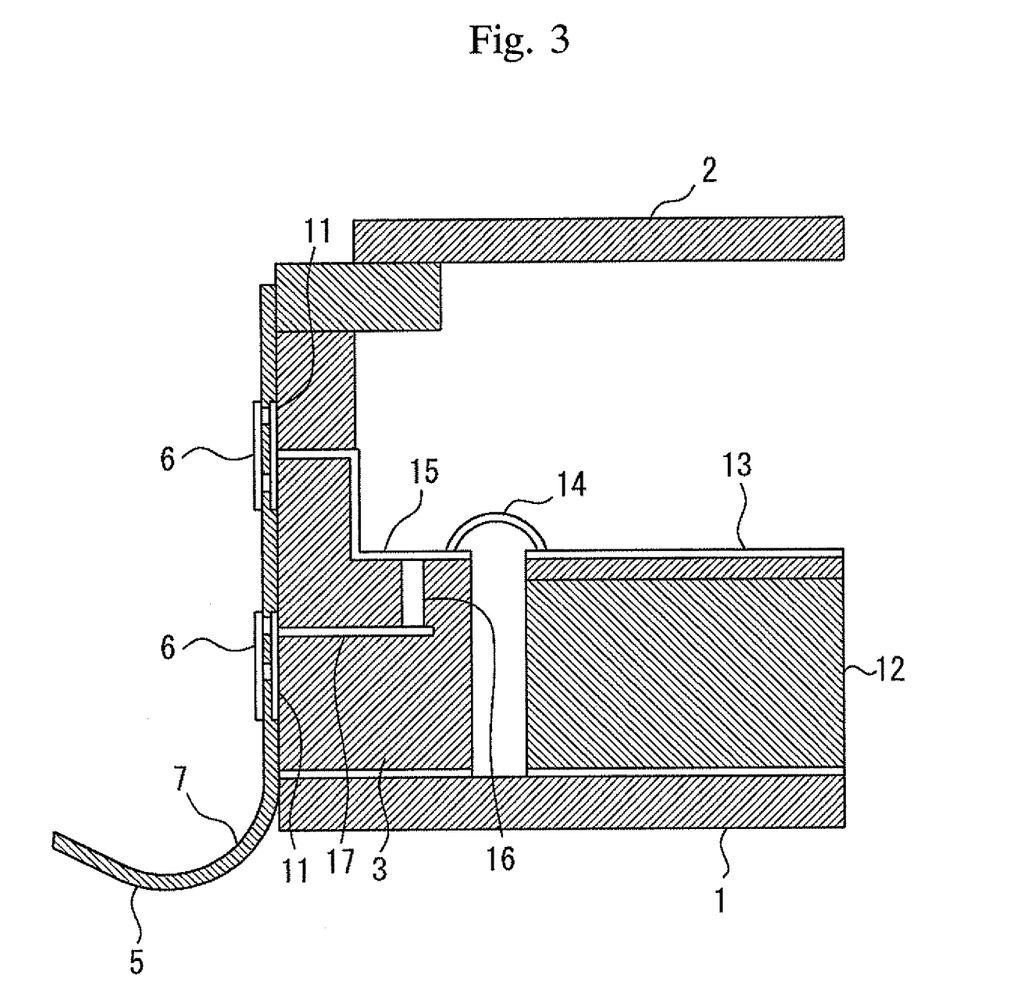
FIG. 3 is a sectional side view taken along line III-III of FIG. 1.
Figure 4:
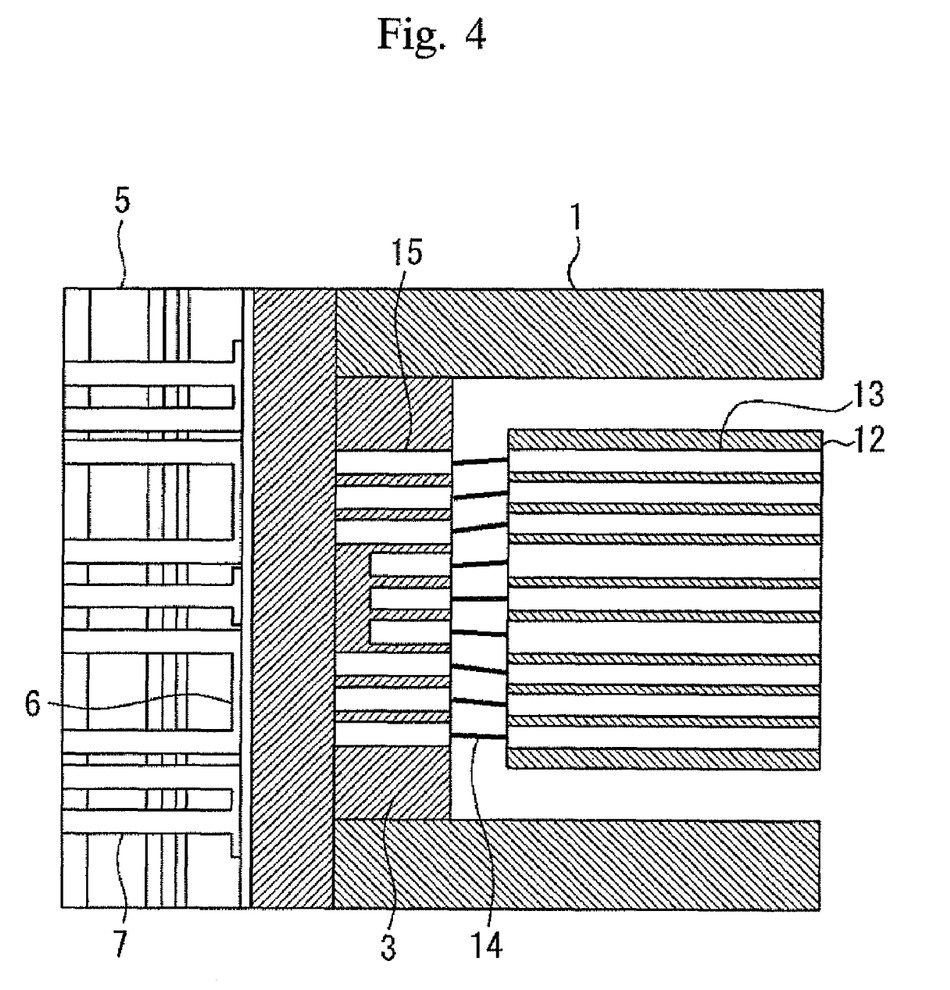
FIG. 4 is a plan view showing that a cover is removed from First Embodiment shown in FIG. 1.
Figure 5:
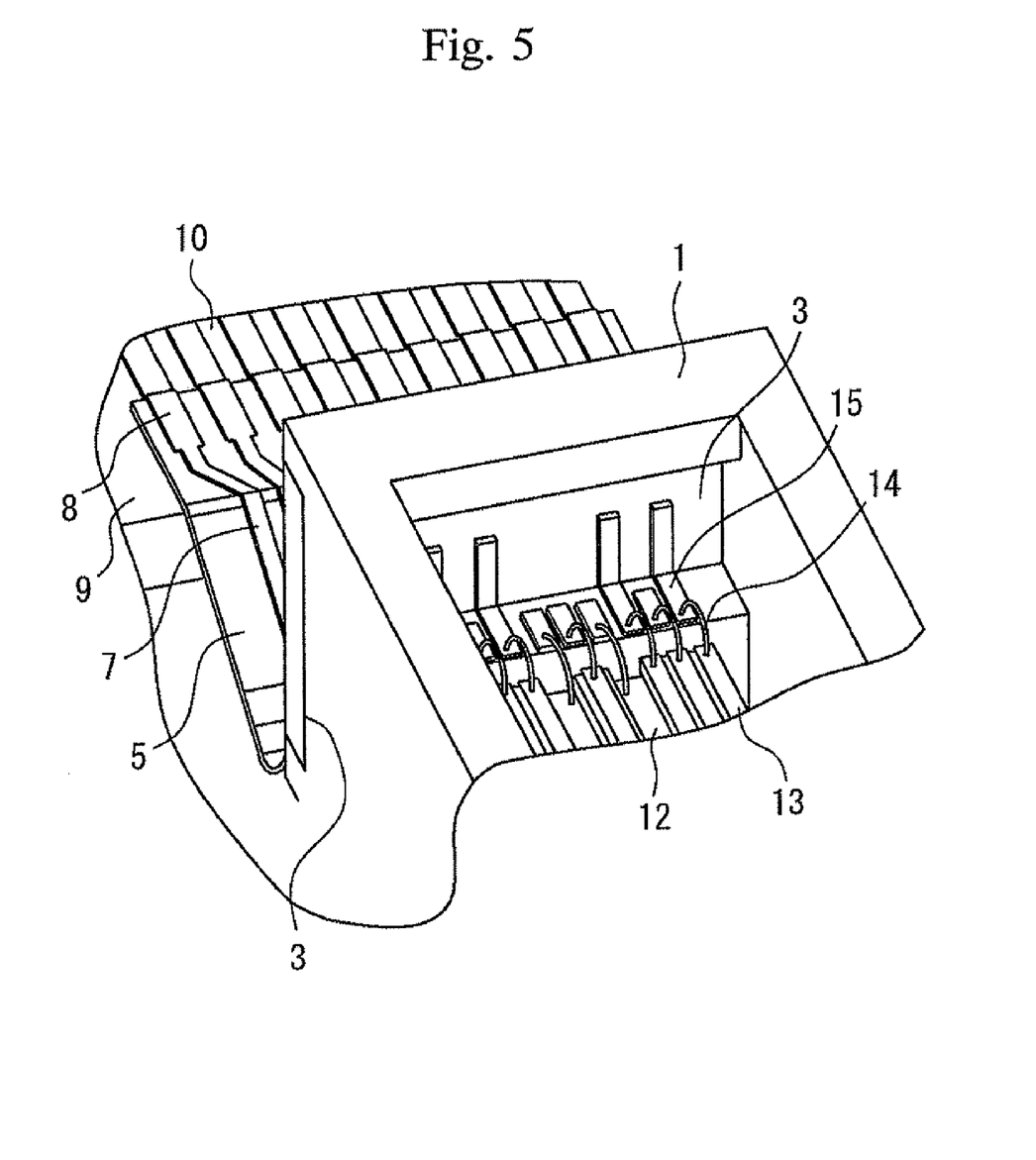
FIG. 5 is a perspective view showing the same state as FIG. 4.
Figure 6:
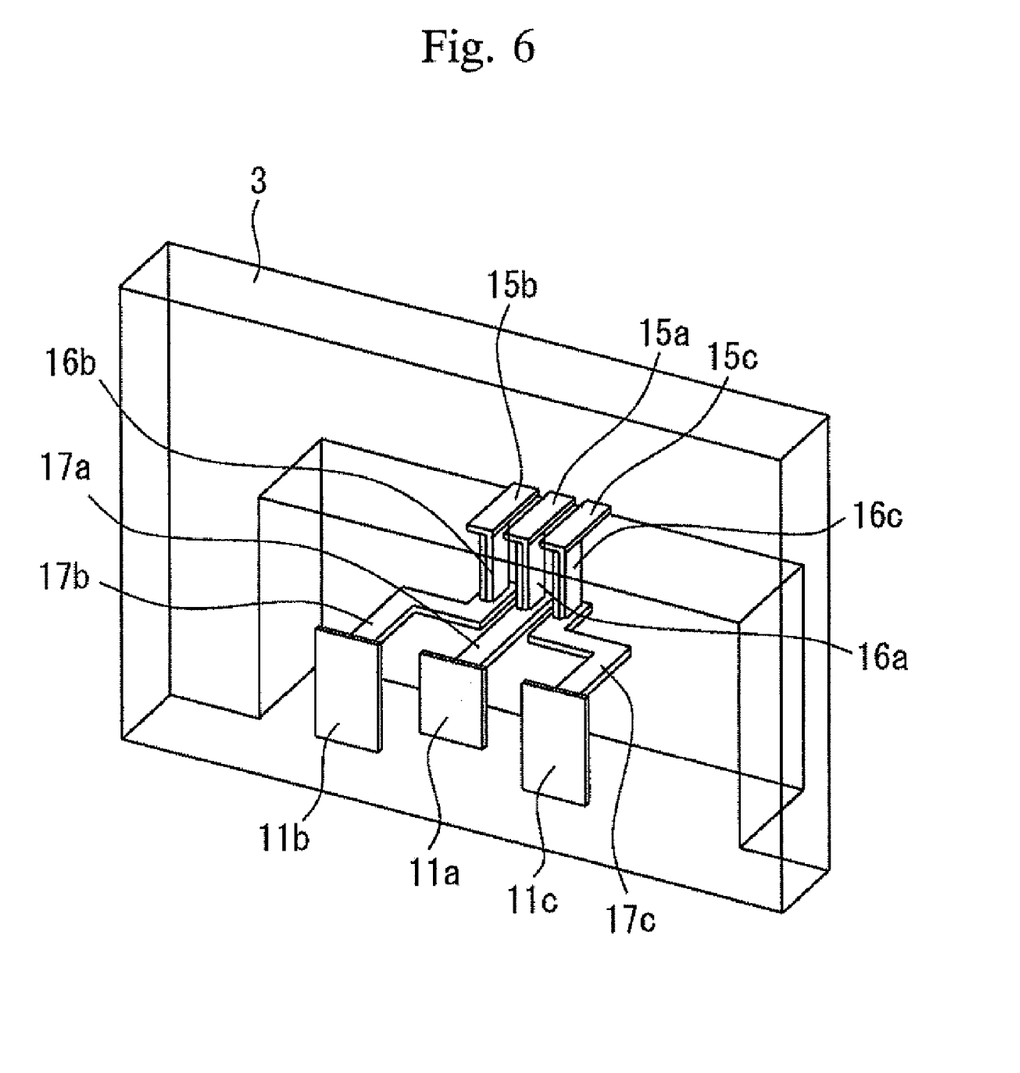
FIG. 6 is a perspective view showing the internal configuration of a feedthrough of FIG. 2.

First Embodiment of the present invention will be described below in accordance with the accompanying drawings. FIG. 1 is a perspective view showing the configuration of First Embodiment. FIG. 2 is a perspective view showing that a flexible printed circuit board is removed from First Embodiment. FIG. 3 is a sectional side view taken along line III-III of FIG. 1. FIG. 4 is a plan view showing that a cover is removed from First Embodiment shown in FIG. 1. FIG. 5 is a perspective view showing the same state as FIG. 4. FIG. 6 is a perspective view showing the internal configuration of a feedthrough of FIG. 2. Only a high-frequency transmission line is shown.

As evident from FIGS. 1 and 2, a receptacle 4 which acts as a light extraction port and forms an optical connector is disposed on one end of a package 1 constituting the body of an optical module. A fiber (not shown) is attached to the receptacle 4.

A feedthrough 3 acting as an extraction port of an electrical signal is disposed on the other end of the package 1. FIG. 3 shows the configuration of a feedthrough 3 in cross section. As shown in the perspective view of FIG. 6, the feedthrough 3 is formed by laminating, for example, ceramic. Feedthrough wiring patterns 15a, 15b, and 15c are arranged in parallel on a ceramic laminated surface, feedthrough inner layer patterns 17a, 17b, and 17c are provided in a ceramic inner layer such that one ends of the inner layer patterns reach the outer surface of the feedthrough 3. Further, vias 16a, 16b, and 16c are provided to connect the feedthrough wiring patterns 15a, 15b, and 15c and the feedthrough inner layer patterns 17a, 17b, and 17c.

After the patterns and vias are cofired, feedthrough connecting pads 11a, 11b, and 11c are patterned as so-called side metallization on the outer surface of the feedthrough 3. The feedthrough connecting pads 11a, 11b, and 11c are connected to the feedthrough inner layer patterns 17a, 17b, and 17c, respectively, and disposed perpendicularly to the optical axis of incoming/outgoing light of the optical connector.

In high-frequency transmission, the three feedthrough wiring patterns, the three feedthrough inner layer patterns, the three vias, and the three feedthrough connecting pads are connected as shown in FIG. 6. The feedthrough wiring pattern 15a, via 16a, feedthrough inner layer pattern 17a, and feedthrough connecting pad 1a which are disposed at the center are used as a signal line and the patterns, vias, and connecting pads on both sides are used as ground patterns, so that a coplanar line of G-S-G structure is configured to transmit a high-frequency signal.

As shown in FIGS. 3 to 5, the package 1 includes a carrier 12 equipped with optics such as an optical modulation device. Inner wiring boards 13 for electrical connection with optics are provided on a surface of the carrier 12. The inner wiring plates 13 and feedthrough wiring patterns 15 of the feedthrough 3 are connected via wires 14. Reference numeral 2 denotes the cover of the package 1.

A flexible printed circuit board (FPC) 5 is fixed on the feedthrough 3 of the package 1. The fixing method will be discussed later.

The FPC 5 includes FPC side connecting pads 6 positioned so as to correspond to connecting pads 11 of the feedthrough 3, printed board connecting pads 8 are provided on the end of the FPC 5 so as to act as joints with a printed wiring board (discussed later), and the FPC side connecting pads 6 and the printed board connecting pads 8 are connected via FPC wiring patterns 7.

Printed board wires 10 are provided on a printed board 9 disposed close to the feedthrough 3 and connected to the printed board connecting pads 8 of the FPC 5 with solder or the like.

The following will discuss the operations of First Embodiment. An electrical signal having undergone high-speed modulation through the printed board wire 10 on the printed board 9 is inputted to the feedthrough side connecting pad 11 through the printed board connecting pad 8, the FPC wiring pattern 7, and the FPC connecting pad 6. Thereafter, the signal is fed to the optical modulation device of the carrier 12 through a feedthrough inner layer pattern 17, a via 16, a feedthrough wiring pattern 15, the wire 14, and the inner wiring plate 13.

The feedthrough 3 and the FPC 5 are fixed by applying an anisotropic conductive adhesive to both of the feedthrough 3 and the FPC 5. Thus, by matching the positions of the feedthrough side connecting pads 11 with the positions of the FPC side connecting pads 6, only a part between the corresponding connecting pads is conducted and a part between adjacent connecting pads is not conducted.

In First Embodiment configured thus, the coplanar line of G-S-G structure makes it possible to transmit a high-frequency signal. Since the feedthrough 3 and the printed circuit board 9 are connected via the FPC 5, the degree of freedom can be sufficiently obtained in terms of mechanism.

Second Embodiment

Second Embodiment of the present invention will be described below. The overall configuration of an optical module and a printed board is similar to that of First Embodiment, and thus the configuration is not shown and the explanation thereof is omitted.

Second Embodiment is characterized by a method of fixing a feedthrough 3 and a FPC 5.

In First Embodiment, the feedthrough 3 and the FPC 5 are fixed with an anisotropic conductive adhesive, which causes relatively worse high-frequency characteristics.

In order to obtain better high-frequency characteristics, in Second Embodiment, feedthrough connecting pads 11 and FPC side connecting pads 6 are bonded with solder, without using an anisotropic conductive adhesive.

This configuration makes it possible to realize an optical module with improved high-frequency characteristics.

Third Embodiment

Third Embodiment of the present invention will be described below. The overall configuration of an optical module and a printed board is similar to that of First Embodiment, and thus the configuration is not shown and the explanation thereof is omitted.

Third Embodiment is characterized by a method of fixing a feedthrough 3 and a FPC 5.

In Second Embodiment, the feedthrough connecting pads 11 and the FPC side connecting pads 6 are fixed and connected with solder. Although a soldered connection can help improve high-frequency characteristics, a short circuit may occur between adjacent pads.

In order to resolve the defect, in Third Embodiment, feedthrough connecting pads 11 and FPC side connecting pads 6 are connected by thermocompression bonding after being gold plated.

This configuration makes it possible to improve high-frequency characteristics and prevent the occurrence of a short circuit between adjacent pads.

Fourth Embodiment

Fourth Embodiment of the present invention will be discussed below in accordance with the accompanying drawings. Fourth Embodiment is characterized by the configuration of a FPC 5. The other configurations of an optical module and a printed board are similar to those of First Embodiment, and thus the overall configuration is not shown and the explanation thereof is omitted.

Figure 7:
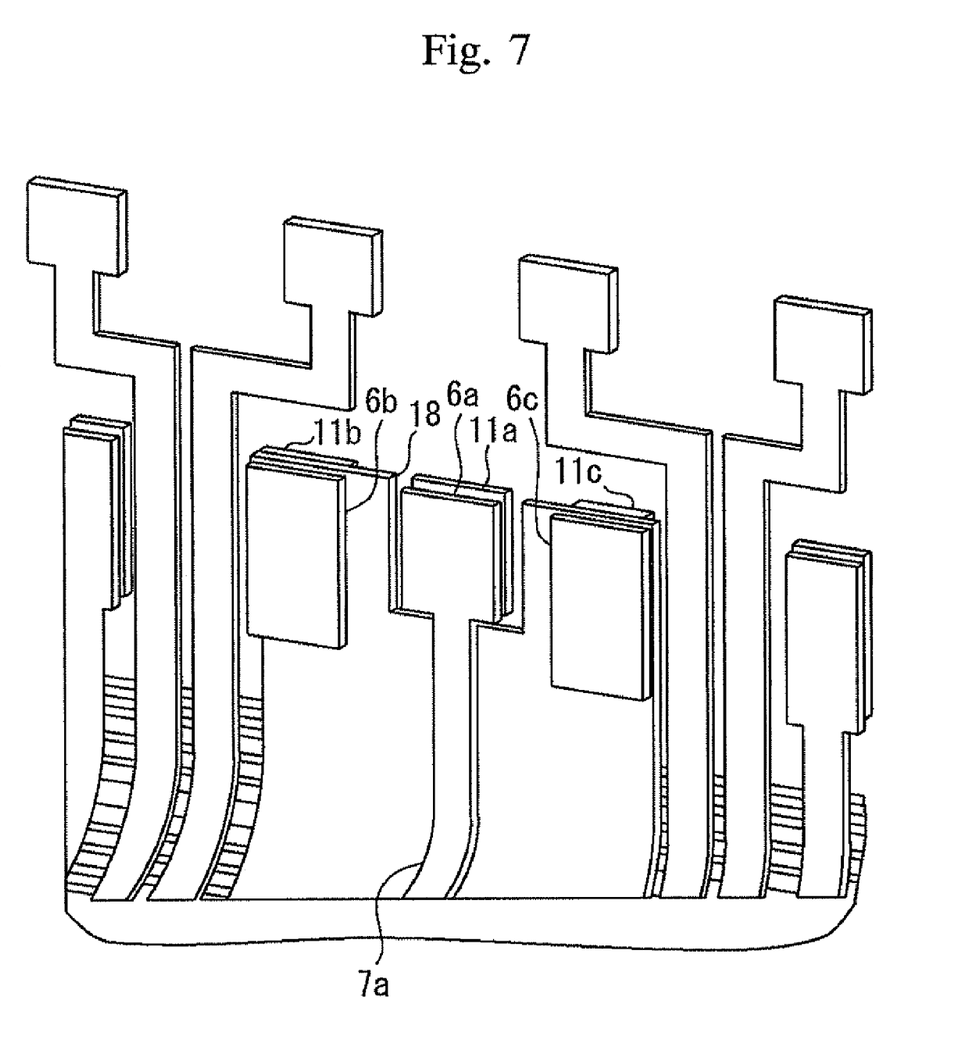
FIG. 7 is a perspective view showing a flexible printed circuit board of Fourth Embodiment.
Figure 8:
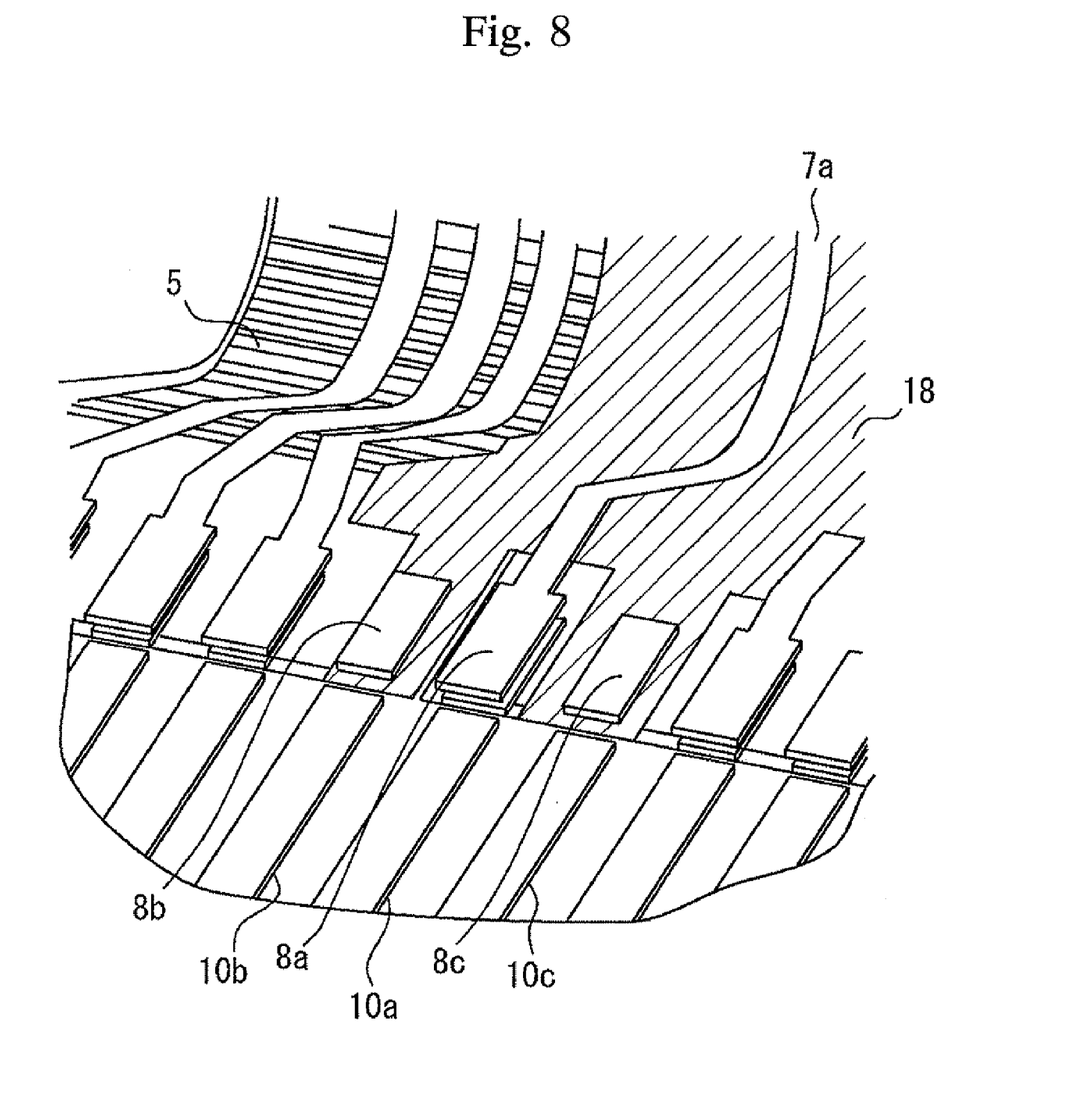
FIG. 8 is perspective view showing a flexible printed circuit board of Fourth Embodiment.

FIG. 7 is a perspective view showing, to explain the configuration of Fourth Embodiment, a configuration around FPC side connecting pads 6, in other words, an enlarged view showing the part of a circle denoted as B in FIG. 1. FIG. 8 is a perspective view showing a configuration around printed board connecting pads 8 of the FPC 5, in other words, an enlarged view showing the part of a circle denoted as C in FIG. 1.

In Fourth Embodiment, FPC ground conductor (ground) patterns 18 are provided on the opposite side from a FPC wiring pattern 7a with the FPC 5 being interposed therebetween. In other words, the FPC wiring pattern 7a is provided on one surface of the FPC 5 and the FPC ground patterns 18 are provided on the other surface of the FPC 5. The FPC ground patterns 18 are connected to FPC side connecting pads 6b and 6c and printed board connecting pads 8b and 8c.

With this configuration, the FPC wiring pattern 7a forms a microstrip line with the FPC ground patterns 18. Coplanar microstrip connection conversion is performed between printed board wiring pads 10a, 10b, and 10c and printed board connecting pads 8a, 8b, and 8c and between feedthrough side connecting pads 11a, 11b, and 11c and FPC side connecting pads 6a, 6b, and 6c, which form a coplanar wiring pattern, and a high-frequency signal is transmitted.

Consequently, in transmission on the FPC 5, an electric field concentrates between the FPC wiring pattern 7a and the FPC ground pattern 18, thereby achieving a configuration less susceptible to electrical interference such as EMI.

Fifth Embodiment

Fifth Embodiment of the present invention will be described below in accordance with the accompanying drawings. Fifth Embodiment is characterized by the layout of the wiring patterns of a FPC 5. The other configurations of an optical module and a printed board are similar to those of First Embodiment, and thus the overall configuration is not shown and the explanation thereof is omitted.

Figure 9:
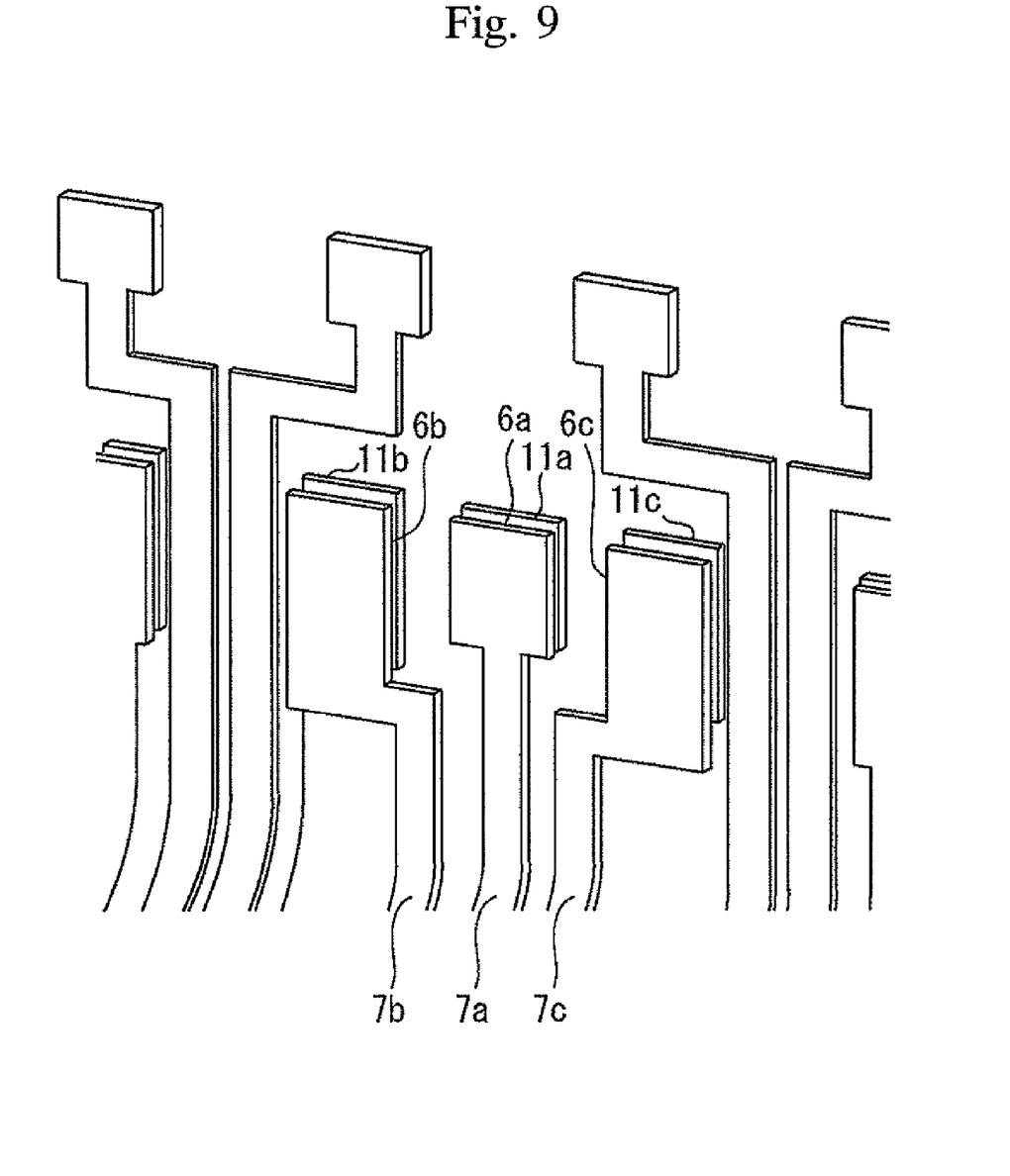
FIG. 9 is a perspective view showing a flexible printed circuit board of Fifth Embodiment.
Figure 10:
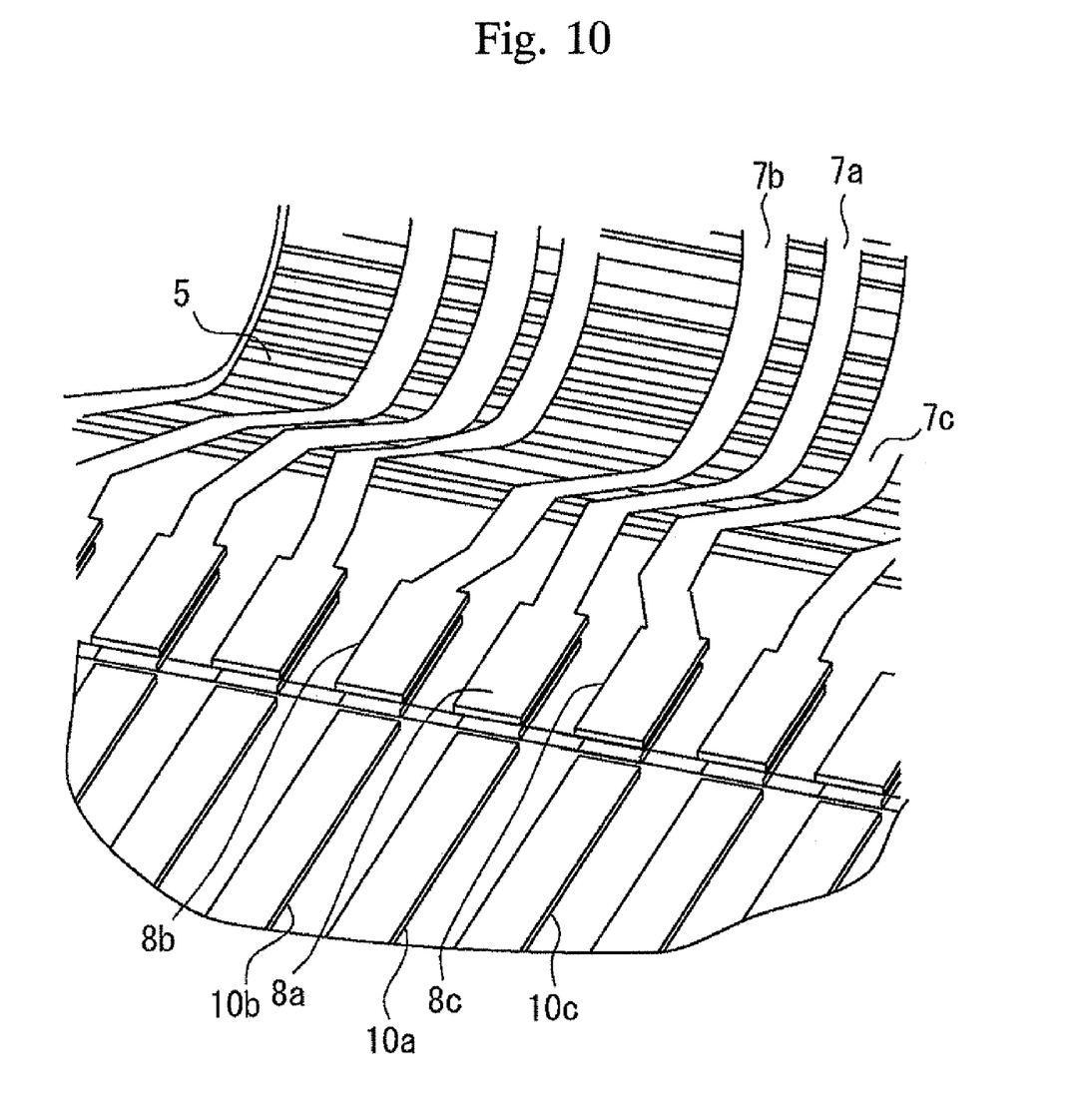
FIG. 10 is a perspective view showing a flexible printed circuit board of Fifth Embodiment.

FIG. 9 is a perspective view showing, to explain the configuration of Fifth Embodiment, a configuration around FPC side connecting pads 6, in other words, an enlarged view showing the part of a circle denoted as B in FIG. 1. FIG. 10 is a perspective view showing a configuration around printed board connecting pads 8 of the FPC 5, in other words, an enlarged view showing the part of a circle denoted as C in FIG. 1.

In Fifth Embodiment, a coplanar line is formed as follows: a high-frequency signal is fed to a FPC wiring pattern 7a connected to a FPC side connecting pad 6a and a printed board connecting pad 8a, and FPC wiring patterns 7b and 7c are grounded. The FPC wiring patterns 7b and 7c are disposed on both sides of the FPC wiring pattern 7a and connected to FPC side connecting pads 6b and 6c and printed board connecting pads 8b and 8c.

With this configuration, wiring patterns are formed on one surface of the FPC 5, so that the FPC 5 can have a simple laminar structure with low cost. Since the number of layers can be reduced, the flexibility of the FPC 5 is also improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-256532, filed on Sep. 5, 2005 including specification, claims, drawings and summary, on which the Convention priority of the present application is based, are incorporated herein by reference in its entirety.

What is claimed is:

1. An optical module comprising:
   an optical connector disposed on a first end of a package for storing a carrier having an optical element,
   a laminated ceramic feedthrough disposed on a second end of the package, the feedthrough including, on an outer surface, an electrical terminal perpendicular to an optical axis of light incident on and exiting from the optical connector, and including on an inner surface a carrier connection terminal connected to the electrical terminal, and
   a flexible printed circuit board which includes a connection pad acting as an electrical terminal at a position corresponding to the electrical terminal of the feedthrough and fixed to the feedthrough with an anisotropic conductive adhesive.

2. An optical module comprising:
   an optical connector disposed on a first end of a package for storing a carrier having an optical element,
   a laminated ceramic feedthrough disposed on a second end of the package, the feedthrough including, on an outer surface, an electrical terminal perpendicular to an optical axis of light incident on and exiting from the optical connector, and including on an inner surface a carrier connection terminal connected to the electrical terminal, and
   a flexible printed circuit board which includes a connection pad acting as an electrical terminal at a position corresponding to the electrical terminal of the feedthrough, the connecting pad being soldered to the electrical terminal of the feedthrough.

3. An optical module comprising:
   an optical connector disposed on a first end of a package for storing a carrier having an optical element,
   a laminated ceramic feedthrough disposed on a second end of the package, the feedthrough including, on an outer surface, a gold-plated electrical terminal perpendicular to an optical axis of light incident on and exiting from the optical connector, and includes on an inner surface a carrier connection terminal connected to the electrical terminal, and
   a flexible printed circuit board which includes a gold-plated connection pad acting as an electrical terminal at a position corresponding to the electrical terminal of the feedthrough, the connecting pad being press-fit to the electrical terminal of the feedthrough.

4. An optical module comprising:
   an optical connector disposed on a first end of a package for storing a carrier having an optical element,
   a laminated ceramic feedthrough disposed on a second end of the package, the feedthrough including, on an outer surfaces, an electrical terminal perpendicular to an optical axis of light incident on and exiting from the optical connector, and including, on an inner surfaces, a carrier connection terminal connected to the electrical terminal, and
   a flexible printed circuit board which includes on a first surface a signal line connected to the electrical terminal of the feedthrough and includes on a second surface a ground pattern constituting a microstrip line with the signal line.

5. An optical module comprising:
   an optical connector disposed on a first end of a package for storing a carrier having an optical element,
   a laminated ceramic feedthrough disposed on a second end of the package, the feedthrough including, on an outer surface, an electrical terminal perpendicular to an optical axis of light incident on and exiting from the optical connector, and includes on an inner surface a carrier connection terminal connected to the electrical terminal, and
   a flexible printed circuit board which includes, on the same surface, a signal line connected to the electrical terminal of the feedthrough and a ground pattern located near the signal line, the ground pattern constituting a coplanar line with the signal line.

* * * * *